(12) United States Patent
Sekiya et al.

(10) Patent No.: US 6,341,740 B2
(45) Date of Patent: Jan. 29, 2002

(54) CUTTING-AND-TRANSFERRING SYSTEM AND PELLET TRANSFERRING APPARATUS

(75) Inventors: Kazuma Sekiya; Takayuki Mahashi; Shinichi Namioka; Takeo Hidaka; Masahiro Yoshii, all of Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/496,964

(22) Filed: Feb. 3, 2000

(30) Foreign Application Priority Data

Feb. 10, 1999 (JP) .......................................... 11-032797

(51) Int. Cl.[7] .............................................. B02C 19/18
(52) U.S. Cl. ...................... 241/101.2; 241/301; 83/704; 451/182
(58) Field of Search ........................... 451/28, 53, 128, 451/182, 188, 445, 450; 83/36, 704, 906; 241/1, 301, 3, 101.4, 101.2

(56) References Cited

U.S. PATENT DOCUMENTS 6,171,176 B1 * 1/2001 Kajiyama et al. ............. 451/28

FOREIGN PATENT DOCUMENTS

| JP | 7-171754 | * | 7/1995 |
| JP | 9-306873 | * | 11/1997 |

* cited by examiner

*Primary Examiner*—Mark Rosenbaum
(74) *Attorney, Agent, or Firm*—Rader, Fishman & Grauer, PLLC (57) ABSTRACT

Disclosed is an improved cutting-and-transferring system for cutting and separating a workpiece into pellets. The workpiece is held by a holder member. The system comprises: a holding table for holding a workpiece to be cut; a cutting unit including at least cutting means for cutting the workpiece on the holding table into pellets; a transferring unit including at least transferring means for picking up the pellets from the holder member and for transferring to a selected carrier tray; and a shuttle transfer unit for transferring a selected cut workpiece from the cutting unit to the transferring unit. All these parts work automatically in unison, thus reducing the length of time involved for cutting workpieces into pellets and for loading carrier trays with pellets to possible minimum.

6 Claims, 8 Drawing Sheets

CUTTING-AND-TRANSFERRING SYSTEM AND PELLET TRANSFERRING APPARATUS

BACKGROUND OF THE INVENTION

1. Field of the Invention

The present invention relates to a cutting-and-transferring system for cutting and separating a workpiece into individual pellets and for loading carrier trays with such pellets, and to a pellet transferring apparatus for transferring pellets from the cutting apparatus to carrier trays.

2. Related Arts

Recently chip size packages (abbreviated as "CSPs") have been widely used. A plurality of semiconductor chips each having LSIs built therein are arranged, and resin-sealed together to form a CSP substrate, and then the CSP substrate is cut into packaged pellets, each being as large as the original semiconductor chip. Advantageously the CSP device is small in size, requiring a minimum space for installation in personal computers, cellular phones and the like.

Figure 11:
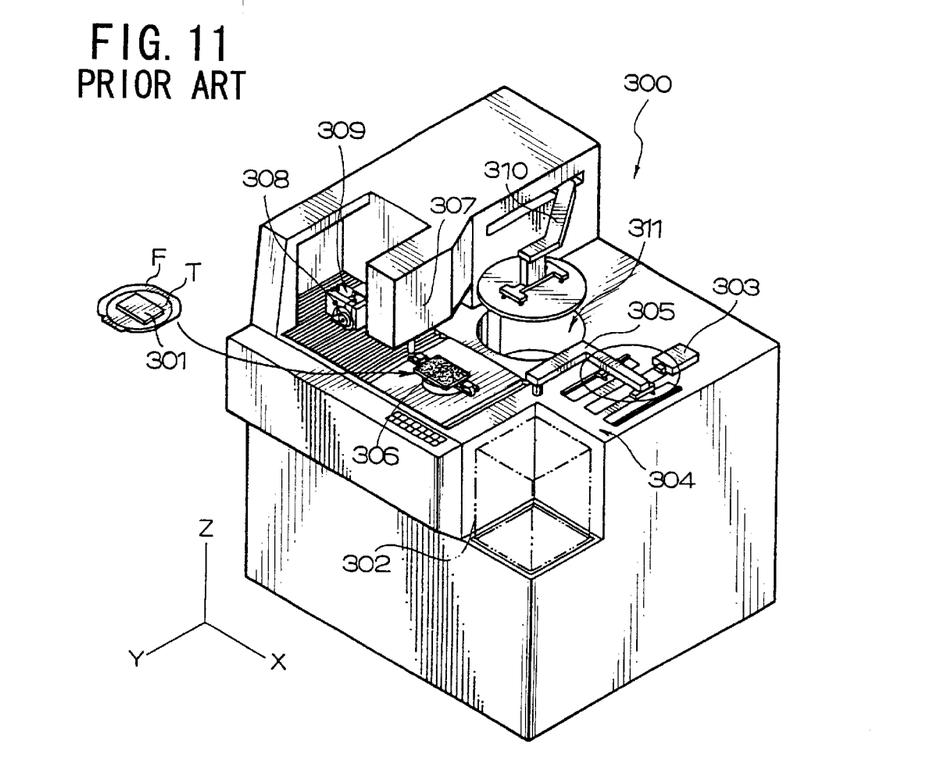
FIG. 11 is a perspective view of a conventional cutting apparatus.

Referring to FIG. 11, a cutting apparatus 300 is used in cutting CSP substrates 301. A plurality of carrier frames each having a CSP substrate attached thereon by an adhesive tape T are stacked on each other to be stored in a cassette 302.

The CSP substrate 301 is transferred from the cassette 302 to the tentative storage area 304, where the CSP substrate 301 is sucked and held by the first transferring means 305. Then, the first transferring means 305 turns to bring the CSP substrate 301 to the chuck table 306. The CSP substrate 301 is laid on the chuck table 306 to be sucked and held thereon.

Then, the chuck table 306 is moved in the X-axial direction to be put just under the alignment means 307. A picture of the CSP substrate 301 is taken there to determine where a required cutting may be effected on the CSP substrate 301, and the rotary blade 308 is aligned to a selected cutting line traversing the Y-axis on the CSP substrate 301. Then, the chuck table 306 is moved in the X-axial direction, allowing the rotary blade 308 to cut the CSP substrate 301. This is repeated as many times as the cutting lines running in X-axial directions. After finishing the cutting along each and every cutting line running in the X-axial direction, the chuck table 306 turns 90 degrees, so that the crosswise cutting is repeated, so that the CSP substrate is separated into square pellets.

These pellets are still held on the frame F with the adhesive tape T, and the so cut and separated CSP substrate is transferred to the washing means 311 by the second transferring means 310. The cut and separated CSP substrate is washed there to remove debris, and then the pellets are dried by air blowing.

After the cut and separated CSP substrate is dried, the first transferring means 305 transfer it to the tentative storage area 304, where the taking-in and -out means pushes the separated CSP substrate in a selected slot in the cassette 302. The sequential steps are repeated for each and every CSP substrate so that the frames F each bearing pellets in order are stacked in the cassette 302. Then, the cassette 302 is transported to a selected transferring apparatus in which individual pellets are transferred to carrier trays.

The subsequent pellet-transferring work cannot start before all cut CSP substrates have been put in another cassette 302. Therefore, all units in the transferring apparatus are dormant for the while. Accordingly the yielding rate is lowered. Still disadvantageously, a tedious work is required in removing the cassette 302 from the cutting apparatus 300 and carrying it to the transferring station.

Therefore, there has been an increasing demand for reducing tedious works and for improving the efficiency with which a series of steps may be performed, starting from the cutting of workpieces such as CSPs and ending with the loading of carrier trays with separate pieces such as pellets.

SUMMARY OF THE INVENTION

To meet such a demand a cutting-and-transferring system for cutting and separating a workpiece into pellets and for transferring such pellets to carrier trays according to the present invention comprises: a holding table for holding a workpiece to be cut, the workpiece being retained by a holder member; a cutting unit including at least cutting means for cutting the workpiece on the holding table into pellets; a transferring unit including at least transferring means for picking up the pellets from the holder member and for transferring to a selected carrier tray; and a shuttle transfer unit for transferring a selected cut workpiece from the cutting unit to the transferring unit.

The shuttle transfer unit may be built in the transferring unit.

The cutting unit may comprise: a cassette storage area for storing a cassette containing a stack of workpieces; a carrying means for removing a selected workpiece from the cassette; a tentative storage area in which the workpiece thus removed and transferred is laid; a first transferring means for transferring the workpiece from the tentative area to the holding table; an alignment means for detecting the cutting area of the workpiece on the holding table; a cutting means for cutting the so detected cutting area of the workpiece; a washing means for washing the cut workpiece; a second transferring means for transferring the cut workpiece from the holding table to the washing means; a third transferring means for transferring the cut workpiece from the washing means to the tentative storage area; and a fourth transferring means for transferring the cut workpiece from the tentative storage area to a boarding area where the cut workpiece is picked up to be transferred from the cutting unit to the transferring unit; and the transferring unit comprises: a shuttle transferring means for picking up the cut workpiece in the bordering area; a tentative storage means in which the cut workpiece is released from the shuttle-transferring means to be tentatively laid there; a transfer means for transferring the cut workpiece from the tentative storage means to a pick-up table where the cut workpiece is laid to allow the pellets to be picked-up; a pellet transferring means for picking up pellets from the pick-up table to a selected carrier tray; a disposal means for disposing the holder members from which pellets have been removed by the pellet transferring means; an empty-tray storage means for storing empty trays; a loaded-tray storage means for storing trays loaded with pellets; and a tray-transferring table for transferring a selected empty tray from the empty-tray storage means to the pellet transferring means and for transferring a pellet-loaded tray to the loaded-tray storage means.

The pellet transferring means may comprise: a pellet orienting means; a first pick-up means for picking up pellets from the pick-up table to put the pellet thus picked up on the pellet orienting means; and a second pick-up means for picking up and transferring the oriented pellet from the pellet orienting means to a selected carrier tray.

The cutting-and-transporting system may further comprise an additional transferring unit, which is placed to adjoin the transferring unit so that a selected cut workpiece may be transferred to the shuttle transferring means of the subsequent transferring unit via the tentative storage means.

The cutting-and-transferring system may further comprise an ultraviolet radiator means placed in the boarding area, thereby permitting a selected cut workpiece to be exposed to ultraviolet rays when transferred from the tentative storage area to the boarding area, thus lowering the adhesive capability of the holder member of ultraviolet-sensitive adhesive tape.

With the above described arrangement the cutting of a selected workpiece is directly followed by the transporting of the cut workpiece to the transferring unit, thereby permitting the loading of a selected carrier tray with pellets. The cutting-to-transferring continuity makes it unnecessary for the transferring unit to wait a relatively long time for arrival of a cassette containing cut workpieces therein.

A pellet transferring apparatus according to the present invention comprises: a shuttle transferring means for picking up a selected cut workpiece from the cutting unit; a tentative storage means in which the cut workpiece is released from the shuttle transferring means; a transfer means for transferring the cut workpiece to a pick-up table where the cut workpiece is laid to allow the pellets to be removed and picked up; a pellet transferring means for picking up pellets from the pick-up table to a selected carrier tray; a disposal means for disposing the holder members from which pellets have been removed by the pellet transferring means; an empty-tray storage means for storing empty trays; a loaded-tray storage means for storing trays loaded with pellets; and a tray transferring table 76 for transferring empty trays from the empty-tray storage means to the pellet transferring means and for transferring pellet-loaded trays to the loaded-tray storage means.

The pellet transferring means may comprise: a pellet orienting means; a first pick-up means for picking up pellets one after another from the cut workpiece on the pick-up table to put the pellet thus picked up on the pellet orienting means; and a second pick-up means for picking up and transferring the oriented pellet from the pellet orienting means to a selected carrier tray.

The pellet transferring apparatus may further comprise an additional transferring apparatus, which is placed to adjoin the leading transferring apparatus so that a selected cut workpiece may be transferred to the shuttle transferring means of the subsequent transferring unit via the tentative storage means.

An existing cutting apparatus can have the same capability as the cutting-and-transferring system simply by combining it with the pellet transporting apparatus as described above.

Other objects and advantages of the present invention will be understood from the following description of cutting-and-transferring systems and transferring apparatuses according to preferred embodiments of the present invention, which are shown in accompanying drawings.

DETAILED DESCRIPTION OF PREFERRED EMBODIMENT

Figure 1:
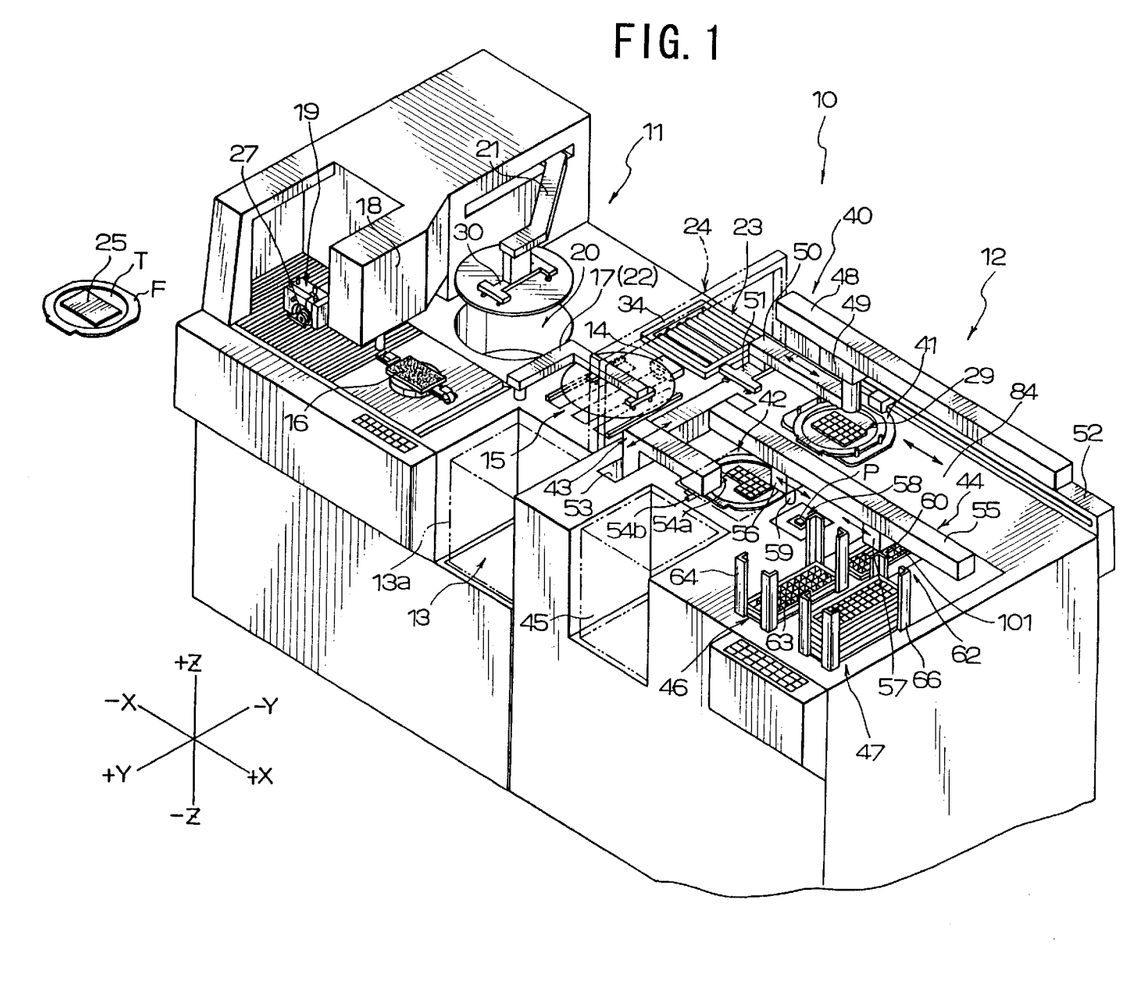
FIG. 1 is a perspective view of a cutting-and-transferring system according to a first embodiment of the present invention.

Referring to FIG. 1, a cutting-and-transferring system 10 comprises a cutting unit 11 for cutting and separating a workpiece into individual pieces or pellets and a transferring unit 12 for transferring pellets from the cutting unit 11 to carrier trays.

As shown, the cutting unit 11 comprises: a cassette storage area 13 for storing a cassette 13a containing a stack of workpieces; a transferring means 14 for removing and transporting a selected workpiece from the cassette; a tentative storage area 15 in which the workpiece thus removed and transported is laid; a holding table 16; a first transferring means 17 for transferring the workpiece from the tentative area 15 to the holding table 16; an alignment means 18 for detecting the cutting area of the workpiece on the holding table 16; a cutting means 19 for cutting the so detected cutting area of the workpiece; a washing means 20 for washing the cut workpiece; a second transferring means 21 for transferring the cut workpiece from the holding table 16 to the washing means 20; a third transferring means 22 for transferring the cut workpiece from the washing means 20 to the tentative storage area 15; and a fourth transferring means 24 for transferring the cut workpiece from the tentative storage area 15 to a boarding area 23 where the cut workpiece is picked up to be transferred from the cutting unit 11, particularly the tentative storage area 15 to the transferring unit 12. In this particular embodiment the first transferring means 17 takes the part of the third transferring means 22.

Figure 2:
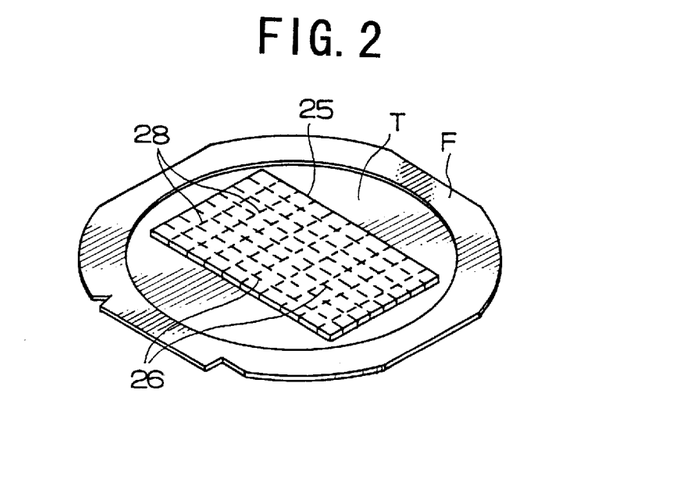
FIG. 2 is a perspective view of a frame having a CSP substrate attached thereto by an adhesive tape.

Referring to FIG. 2, a workpiece to be cut, such as a CSP substrate 25 is attached to a frame F with an adhesive tape T, and a plurality of frames each having a workpiece held thereon are stacked and contained in a cassette 13a. The adhesive tape T may be an ultraviolet sensitive tape, which is liable to lose its adhesive capability when exposed to the ultraviolet rays. Alternatively it may be made of a material which is sensitive to temperature, as for instances, it may lose its adhesive capability when heated or cooled.

The transferring means 14 takes a selected CSP substrate 25 out of the cassette 13a to transfer it to the tentative storage area 15, in which the CSP substrate 25 is laid. The first transferring means 17 holds the CSP substrate 25 by applying a negative pressure thereto, and then the first transferring means 17 turns to transfer the workpiece from the tentative area 15 to the holding table 16.

The holding table 16 is driven in the X-axial direction to carry the CSP substrate 25 to the alignment means 18. A picture of the CSP substrate 25 is taken there to detect the cutting area of the CSP substrate 25 on the holding table 16 according to the pattern matching process, as for instance, one of the cutting lines 26 is selected to cut the CSP substrate therealong (see FIG. 2). The cutting means 19 such as a rotary blade 27 is put in alignment with the so selected cutting line 26 of the CSP substrate by moving the rotary blade 27 along the Y-axial direction. Then, the holding table 16 is driven in the X-axial direction to cut the CSP substrate with the rotary blade 27.

The cutting blade 19 is displaced the inter-cutting line distance along the Y-axial direction every time the CSP substrate 25 has been cut along a selected cutting line, and the cutting blade 19 starts cutting the CSP substrate 25 along the adjacent cutting line. This is repeated to cut the CSP substrate 25 along each and every cutting line 26 in the X-axial direction. Then, the CSP substrate 25 turns 90 degrees, and the same procedure is repeated as many times as the cutting lines 28 running parallel in the Y axial direction. Thus, the CSP substrate 25 is cut and separated into individual pellets P.

The so cut and separated CSP substrate 29 remains to be attached to the adhesive tape T in the frame F, and it is sucked to the sucking head 30 of the second transferring means 21 to be carried to the washing means 20. The cut CSP substrate 29 is lowered to be put in the washing area to remove debris and dust from the cut CSP substrate 25, and then it is dried by air blowing.

The third transferring means 22 transfers the cut CSP substrate 29 from the washing means 20 to the tentative storage area 15, and the fourth transferring means 24 transfers the cut CSP substrate 25 from the tentative storage area 15 to a boarding area 23 where the cut CSP substrate 29 is picked up to be transferred from the tentative storage area 15 to the transferring unit 12.

Figure 3:
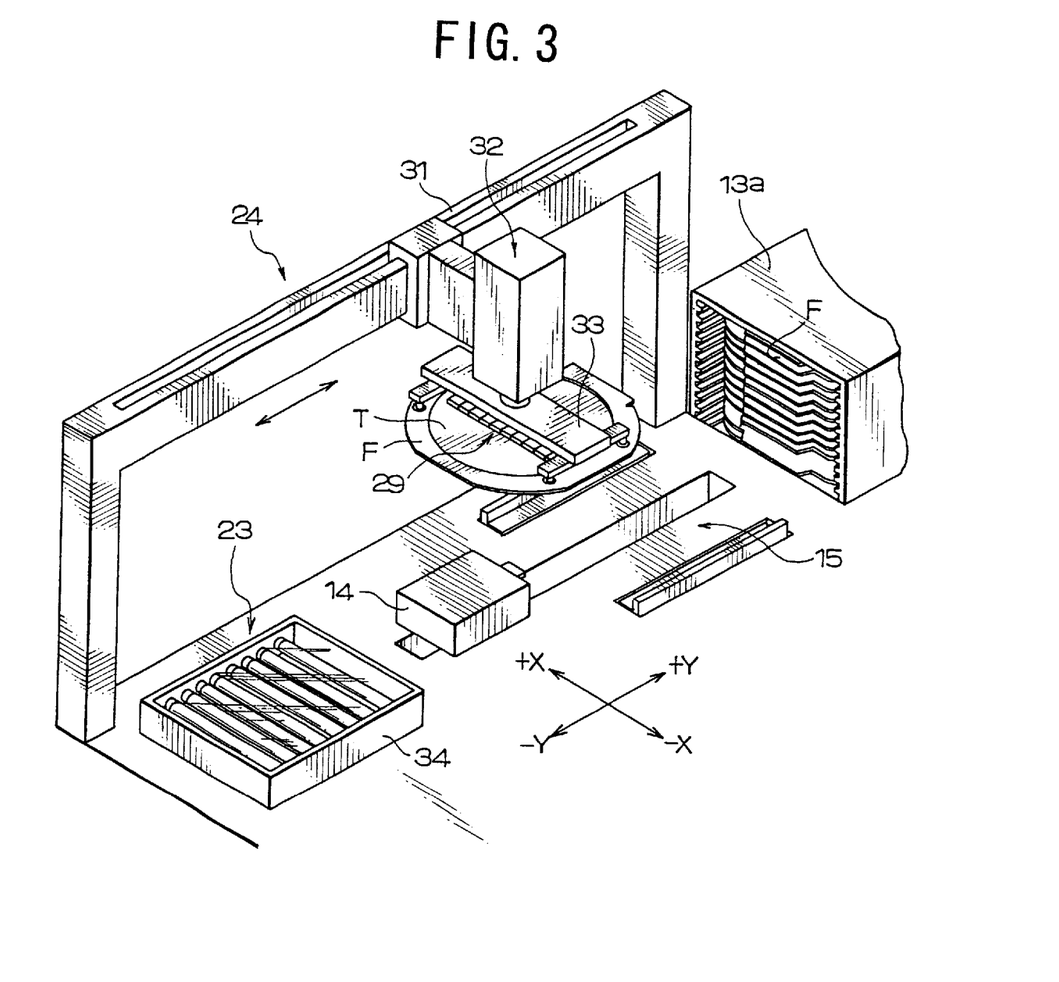
FIG. 3 is a perspective view of a fourth transferring means on the cutting unit of the cutting-and-transferring system.

As seen from FIG. 3, the fourth transferring means 24 comprises a length of rail 31 bridging from the tentative storage area 15 to the boarding area 23, and a carrier 32 movable along the rail 31. It has a vertically movable suction head 33 attached to its lower end.

There is an ultraviolet radiating means 34 in the boarding area 23. The frame F has a cut CSP substrate 29 attached thereto with an ultraviolet-sensitive tape T. The tape T when exposed to the ultraviolet rays will lose its adhesive capability.

In transporting the cut CSP substrate 29 from the tentative storage area 15 to the boarding area 23 the frame F is sucked to the sucking head 33 of the carrier 32, and the frame F is raised, and brought to the boarding area 23 by driving the carrier 32 along the rail 31. Then, the frame F is lowered on the ultraviolet radiator 34. Specifically it is put on the glass plate on the ultraviolet radiator 34 to be laid there for the while, thus lowering the adhesive capability of the tape T to facilitate the picking-up of pellets from the underlying tape T.

A shuttle transferring means 40 takes a selected cut CSP substrate 29 from the boarding area 23. In this particular embodiment the shuttle transferring means 40 is installed in the pellet transferring unit 12, but it may be placed as an independent unit.

Again referring to FIG. 1, in addition to the shuttle transferring means 40 the pellet transferring unit 12 includes a tentative storage means 41 in which the cut CSP substrate 29 is released from the shuttle transferring means 40 to be tentatively laid there; a pick-up table 42 and associated transfer means 43 for transferring the cut CSP substrate 29 from the tentative storage means 41 to the pick-up table 42 where the cut CSP substrate 29 is laid for removal of pellets from the tape T; a pellet transferring means 44 for picking up pellets from the cut CSP substrate laid on the pick-up table 42 to a selected carrier tray; a disposal means 45 for disposing the tapes T from which pellets have been removed by the pellet transferring means 44; an empty-tray storage means 46 for storing empty trays; a loaded-tray storage means 47 for storing trays loaded with pellets; and a tray transferring table 76 for transferring empty trays from the empty-tray storage means 46 to the pellet transferring means 44 and for transferring pellet-loaded trays to the loaded-tray storage means 47.

As seen from FIG. 1, the shuttle transferring means 40 has a carrier 49 movable along its rail in the X-axial direction. The movable carrier 49 has its longitudinal arm 50 extending in the X-axial direction, and the longitudinal arm 50 has a suction head 51 vertically movable in the ±Z-axial directions, thus permitting it to suck and hold a selected cut CSP substrate 29. When the carrier 49 is put at the extremity of the rail 48 in the X-axial direction with its longitudinal arm holding the cut CSP substrate 29, the cut CSP substrate 29 is just above the ultraviolet radiator 34.

In transporting a selected CSP substrate 29 from the boarding area 23 to the transferring unit 12, the carrier of the shuttle transferring means 40 is moved to the boarding area 23 to descend its suction head 51, sucking and raising the CSP substrate 29. The carrier is driven in the +X-axial direction to carry the CSP substrate 29 to the tentative storage area 41. Then, the suction head 51 is lowered until the CSP substrate 29 is put on the tentative storage area 41, and it is released from the suction head 51 by removing the negative pressure from the suction head 51. The CSP substrate 29 is laid with its adhesive tape T down.

The tentative storage means 41 is composed of a plate larger than the frame F, and is movable along the rail running in the X-axial direction. It has means for orienting a workpiece, and the cut CSP substrate 29 when laid on the tentative storage means 41 is oriented relative to the pick-up table 42, to which the cut CSP substrate 29 is transported. In case that two or more transferring apparatuses 12 are cascade-connected, the tentative storage means 41 is driven in the +X-axial direction to bring the cut CSP substrate 29 to the vicinity of the subsequent transferring apparatus.

The pick-up and transfer means 43 is movable in the guide slot 53 extending in the Y-axial direction. The pick-up and transfer means 43 has first and second pinch elements 54a and 54b attached to its end. The pick-up and transfer means 43 catches the frame F on the tentative storage means 41 by pinching the frame F by the surrounding edge to move in the +Y-axial direction, carrying the frame F to the pick-up table 42. When the frame F is put on the pick-up table 42, the tape T is pushed up to put the pellets P in easily separable condition. Also, the upper surface of the pick-up table 42 is irregular enough to reduce the contact area relative to the pellets P, thereby facilitating the picking-up of pellets from the frame F.

The pellet transferring means 44 comprises a length of rail 55 running above the pick-up table 42 in the X-axial direction, a first pick-up means 56, a second pick-up means 57 and a pellet orienting means 58 just under the intermediate portion of the rail 55. The first pick-up means 56 has a suction head 59 attached to its lower end, and likewise, the second pick-up means 57 has a suction head 60 attached to its lower end. The suction heads 59 and 60 vertically movable.

The first pick-up means 56 lowers its suction head 59 down to the pick-up table 42 to suck a selected pellet, and the first pick-up means 56 is driven in the +X-axial direction to the pellet orienting means 58, where it releases the pellet by removing the negative pressure from the pellet. Thus, the pellet is laid on the pellet orienting means 58.

Figure 6:
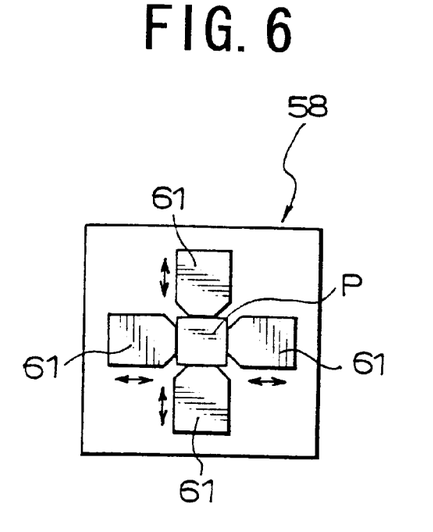
FIG. 6 is a plane view of a pellet orienting mean installed in the pellet transferring apparatus of the cutting-and-transferring system.

Referring to FIG. 6, the pellet orienting means 58 has four orienting pieces 61 movably arranged crosswise thereon, and the pellet P can be put in correct position by allowing these orienting pieces 61 to be driven toward the pellet P simultaneously. Then, the so oriented pellet P is caught by the suction head 60 of the second pick-up means 57 by applying a negative pressure to the pellet P. The second pick-up means 57 carries the pellet P in the +X axial direction to the pellet storage area 62, where a carrier tray is laid to be loaded with pellets.

After removing all pellets from the cut CSP substrate 29 the remaining frame F and tape T is taken by the pick-up transferring means 43, of which the second pinch element 54b catches the frame F by the rear edge, and the frame F and tape T are carried to be put in the disposal means 45 such as a cassette. The tape T is thrown away, but the frame F can be reused.

Figure 7:
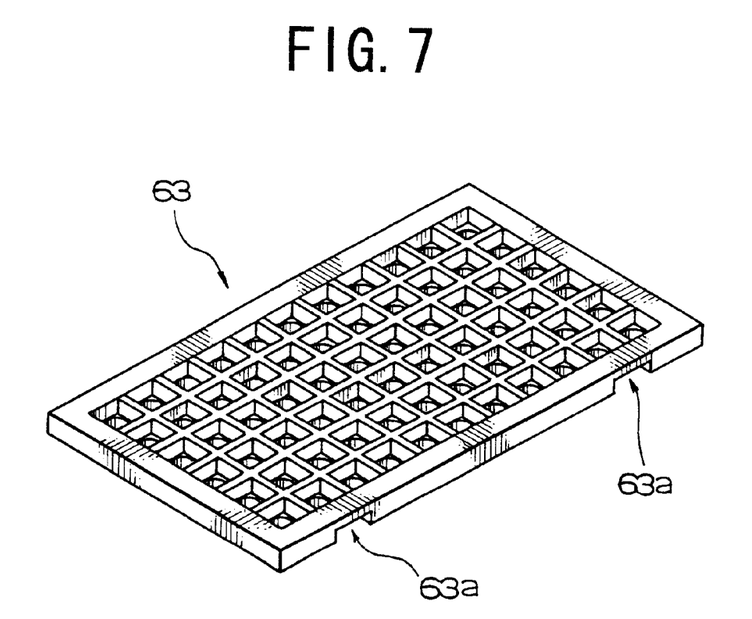
FIG. 7 is a perspective view of a carrier tray.

Referring to FIG. 7, the carrier tray 63 is rectangular in shape, and it has two notches 63a made on each longitudinal side. When the carrier tray 63 is transported to the empty tray storage means 46 or the loaded-tray storage means 47, it is carried by allowing the carrier means to catch the carrier tray 63 by the notches 63a.

The carrier tray 63 has cells formed in the lattice pattern, and each cell is so sized as to accommodate an individual pellet, and it has a circular hole made in its bottom, thereby permitting the pellet to be pushed up and removed from the cell by inserting a pin-like tool in the circular hole.

Figure 4:
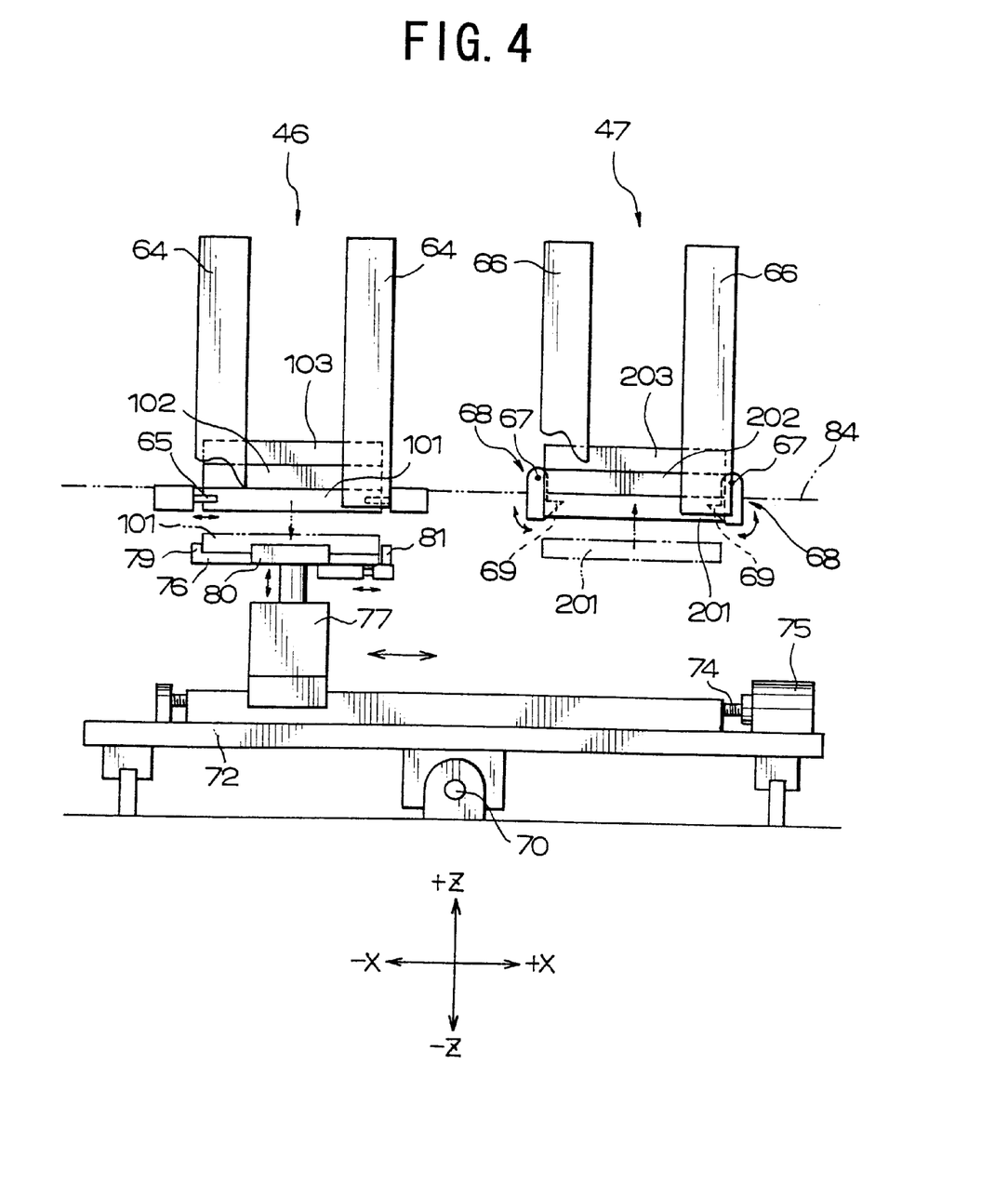
FIG. 4 illustrates a transferring table, an empty tray storing means and a loaded-tray storing means, all installed in the pellet transferring apparatus of the cutting-and-transferring system.

A plurality of carrier trays 63 are stacked in the empty tray storage means 46 in front of the pellet loading area 62. The empty tray storage means 46 has four L-shaped poles 64 standing upright at its corners (see FIG. 4). Referring to FIG. 4, the lowermost tray is caught by the notches 63a by four horizontally movable projections 65 so that it may be prevented from falling, and the lowermost empty carrier tray can be selectively removed one after another from the stack of trays to be transported to the pellet loading area 62 where the carrier tray 63 is loaded with pellets.

After loading the carrier tray 63 with pellets there it is transported to the loaded-tray storage means 47. As is the case with the empty tray storage means 46, the loaded-tray storage means 47 has four L-shaped poles 67 standing upright at its corners (see FIG. 1), and the lowermost tray 201 is caught by the notches 63a by the tapered projections 69 of the four rotary pieces 68 so that it may be prevented from falling (see FIG. 4). These rotary pieces 68 rotate about their pivots 67.

The transporting of carrier trays from the empty tray storage means 46 to the loaded-tray storage means 47 via the pellet loading area 62 is effected inside the transferring apparatus 12, as described below.

Figure 5:
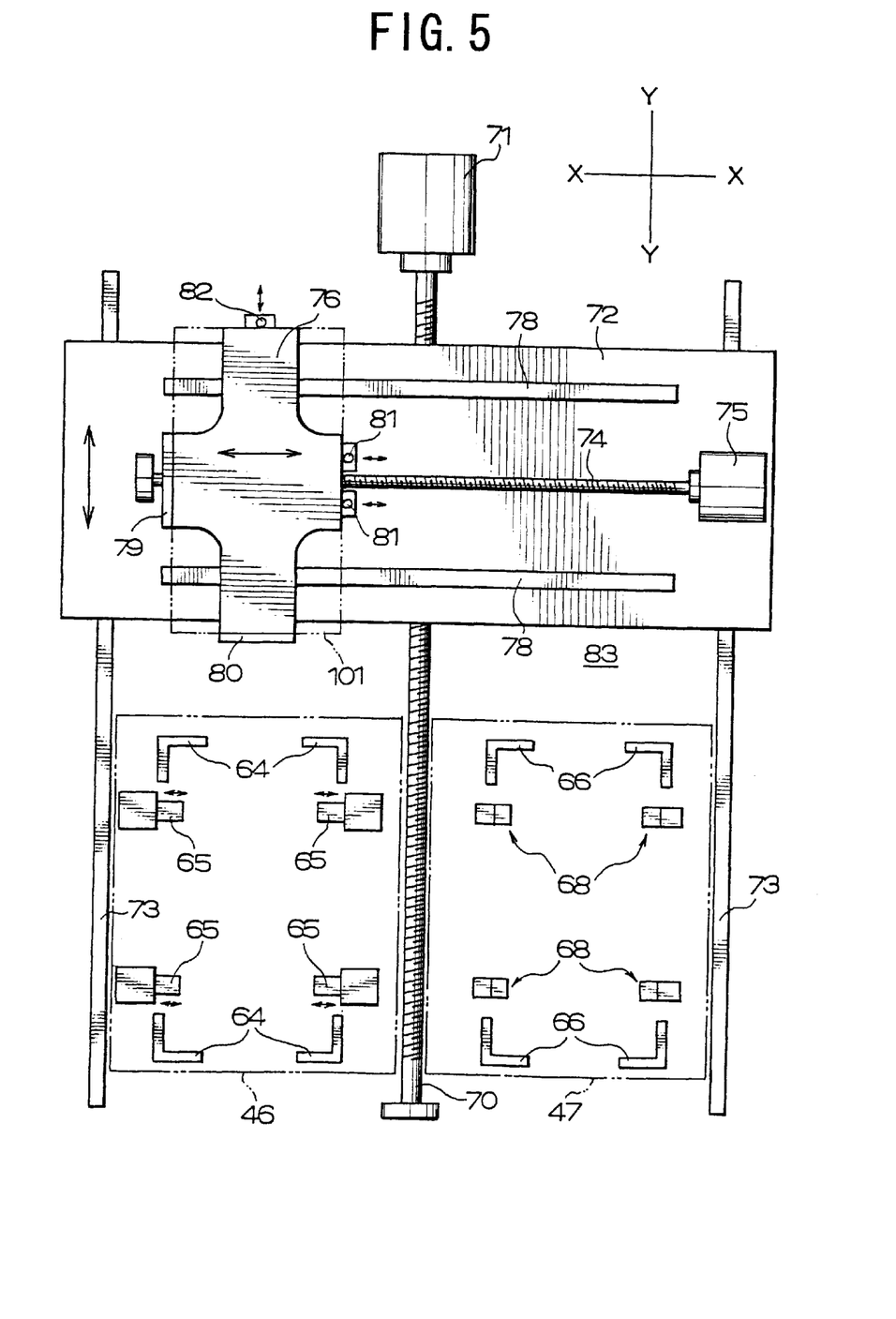
FIG. 5 is a plane view of a mechanism for driving the tray table.

Referring to FIG. 5, the transferring mechanism comprises a first screw rod 70 extending in the Y-axial direction and a stepping motor 71 having its shaft integrally connected to one end of the first screw rod 70, a base 72 threadedly engaged with the first screw rod 70 to be driven by the rotating screw rod 70 in the Y-axial direction while being guided by the opposite guide walls 73, a second screw rod 74 longitudinally traversing the base 72, and a second stepping motor 75 having its shaft connected to one end of the second screw rod 74.

Referring to FIG. 4 again, the second screw rod 74 has a support block 77 threadedly engaged therewith for raising and lowering a carrier table 76, and rotation of the second screw rod 74 will cause the support block 77 to move in the X-axial direction while being guided by a pair of guide walls 78. Thus, the carrier table 76 can be driven both in the X-axial and Y-axial directions within the transferring apparatus 12 when the first and second screw rods 70 and 74 are driven by the first and second stepping motors 71 and 75 respectively.

As seen from FIG. 5, the carrier table 76 is crosswise in shape, and it has walls 79 and 80 integrally connected to two adjacent projecting ends and detent projections 81 and 82 integrally connected to the other adjacent projecting ends. The walls 79 and 80 permit a carrier tray to be fixedly held on the carrier table 76 whereas the detent projections 81 and 82 effectively prevent the carrier table from moving beyond predetermined ranges in the X- and Y-axial directions.

As seen from FIG. 4, a plurality of empty carrier trays 101, 102, 103—are laid on each other in the empty-tray storage means 46. In transporting empty carrier trays from the empty-tray storage means 46 to the pellet loading area 62, first, the carrier table 76 is moved to be put under the empty-tray storage means 46 while the detent projections 81 and 82 are moved as far from the walls 79 and 80 as possible. Then, the carrier table 76 is raised to the level at which the top surface of the carrier table 76 is close to the bottom of the lowest carrier tray, still leaving a gap equal to the thickness of the carrier tray. In this position all empty carrier trays are allowed to fall simultaneously by withdrawing the movable projections 65.

All empty carrier trays fall a distance equal to the thickness of one carrier tray, allowing the lowermost carrier tray to lie on the carrier table 76. Then, the movable projections 65 are made to advance into the notches 63a (see FIG. 7) of the last but one carrier tray 102, thereby supporting the same.

After the empty carrier tray 101 is laid on the carrier table 76 the detent projections 81 and 82 are moved toward the walls 79 and 80 to pinch the empty carrier tray 101 between the detent projections 81, 82 and the walls 79, 80, thus fixing the empty carrier tray 101 on the carrier table 76.

Then, the base 72 is moved in the Y-axial direction to be put under the pellet loading area 62, and then the base 72 is raised to appear in the pellet loading area 62.

In the pellet loading area 62, every time the carrier tray 101 has been loaded with a pellet, the carrier tray 101 is moved step by step in the X-axial or Y-axial direction with the aid of the first or second stepping motor 71 or 75. When the carrier tray 101 is fully loaded with pellets, the thus pellet-loaded tray 201 is sunk in the transferring apparatus by lowering the carrier table 76, and then, the pellet-loaded tray 201 is moved in the X-axial direction to be put in the passing area 83. It is brought under the pellet-loaded tray storage means 47 when the base 72 is driven in the +Y-axial direction.

The rising of the carrier table 76 makes the pellet-loaded tray 201 to approach the loaded tray storage means 47, so that the tapered projections of the opposite rotary pieces 68 are pushed upward, thus making the opposite rotary pieces 68 to yieldingly turn and diverge outward, thereby allowing the pellet-loaded tray 201 to enter the loaded-tray storage means 47. When the pellet-loaded tray 201 passes by the tapered projections 69 of the opposite rotary pieces 76, they are allowed to turn inward to permit their tapered projections 69 to invade the notches 63a of the pellet-loaded tray 201, catching the pellet-loaded tray 201 by the notches 63a.

In this way pellet-loaded trays 201 are stored one after another in the loaded-tray storage means 47. As may be understood from the above, a series of works can be automatically effected, beginning with the cutting of wafers and ending with the boarding-and-transferring of pellets, thus substantially reducing the length of time involved, compared with the transferring of pellet-loaded cassettes from the cutting apparatus to the transferring apparatus as in the conventional system.

Assume that 25 CSP substrates are contained in a single cassette, that it takes 10 minutes to dice a single CSP substrate into pellets, and that it takes 10 minutes to load a carrier tray with as many pellets as cut and separated from a single CSP substrate. Then, the length of time involved for cutting all CSP substrates that are contained in a single cassette can be estimated to be 250 minutes (=25×10 minutes), and the length of time involved for putting all pellets in carrier trays can be estimated to be 250 minutes (=25×10 minutes). Thus, the total length of time is 500 minutes (=250 minutes+250 minutes). Assume that the cutting-and-transferring system of FIG. 1 is used in cutting 25 CSP substrates into pellets, and in putting all pellets in carrier trays. First, the cutting unit of the system of FIG. 1 can start cutting a selected CSP substrate, but the transferring unit cannot start before the cutting of the first CSP substrate has been finished. Specifically the transferring section must wait 10 minutes while the first CSP substrate is being cut, and then the transferring section can work in parallel with the cutting section. More specifically, the cutting of the (n+1)th CSP substrate is being effected in parallel with the loading of the "n"th CSP substrate. Therefore, the cutting and loading work can be finished in 260 minutes (=10 minutes+250 minutes), approximately one half of the length of time involved for cutting and loading in the conventional cassette-by-cassette handling system.

Figure 8:
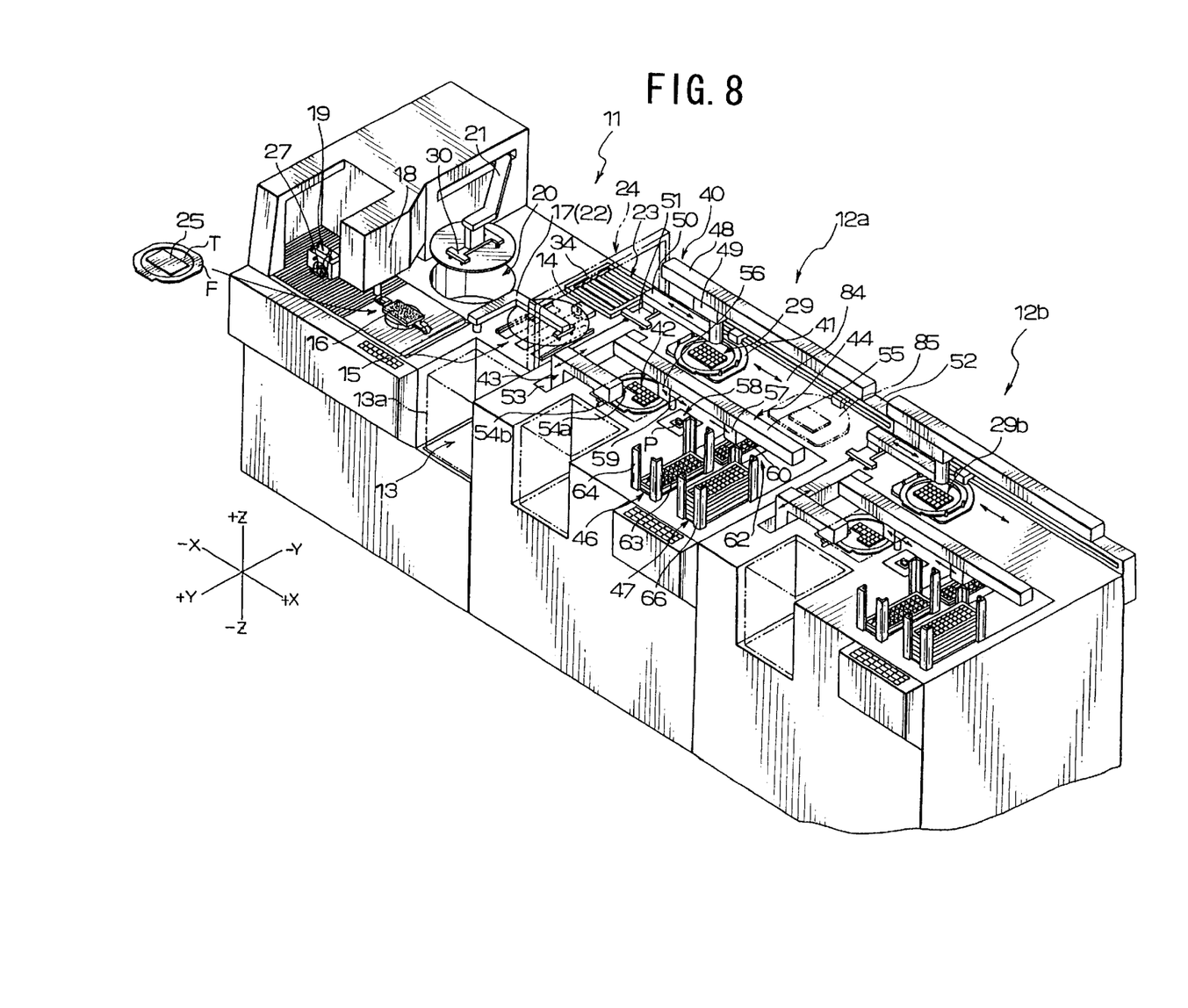
FIG. 8 is a perspective view of a cutting-and-transferring system according to a second embodiment of the present invention.

Referring to FIG. 8, a cutting-and-transferring system according to a second embodiment of the present invention is of a two-cascaded structure, comprising a series combination of first and second pellet transferring apparatuses 12a and 12b, which can work in parallel, thus shortening the length of time involved. In FIG. 8 same parts as in FIG. 1 are indicated by same reference numerals as in FIG. 1.

In operation cut CSP substrates 29b are transported alternately to the first or second transferring apparatus 12a or 12b. Specifically cut CSP substrates 29b are transported to the first transferring apparatus 12a in the same way as in FIG. 1 whereas cut CSP substrates 29b are transported to the second transferring apparatus 12b via the first transferring apparatus 12a. In transporting cut CSP substrates 29b to the second transferring apparatus 12b a cut CSP substrate selected among those laid in the boarding area 24 of the cutting apparatus 11 is sucked to the suction head 51 of the shuttle transferring means 40 of the first transferring apparatus 12a, and then, the longitudinal arm 50 is moved in the +X-axial direction to put the selected cut CSP substrate 29b on the tentative storage means 41. The tentative storage means 41 is driven along the rail 52 in the +X-axial direction to the relay area 85, where the cut CSP substrate 29b is released.

Next, the cut CSP substrate 29b is transported to the second transferring apparatus 12b by the shuttle transferring means 40, where the pellets are put in carrier trays as is the case with the system of FIG. 1.

Two transferring apparatuses 12a and 12b are series-connected and so controlled that the pellet-loading works may be effected simultaneously in parallel. Thus, the length of time involved for cutting CSP substrates and loading carrier trays with pellets can be shortened greatly.

Assume that 25 CSP substrates are contained in a single cassette, that it takes 10 minutes to dice a single CSP substrate into pellets, and that it takes 20 minutes to load a carrier tray with as many pellets as cut from a single CSP substrate. As for the conventional cassette-by-cassette handling system the length of time involved for cutting all CSP substrates that are contained in a single cassette can be estimated to be 250 minutes (=25×10 minutes), and the length of time involved for putting all pellets in carrier trays can be estimated to be 500 minutes (=25×20 minutes). Thus, the total length of time is 750 minutes (=250 minutes+500 minutes). Assuming that the cascaded type of cutting-and-transferring system of FIG. 8 is used in cutting 25 CSP substrates into pellets and in putting all pellets in carrier trays, the cutting and loading work can be finished in 270 minutes, approximately one third of the length of time involved for cutting and loading in the conventional cassette-by-cassette handling system.

Three or more transferring apparatuses can be series-connected depending on the cutting speed attainable. If any one of the transferring apparatuses should happen to be defective, the remaining apparatuses will be allowed to continue their works by excluding the defective one. Therefore, the transferring work need not be discontinued.

Figure 9:
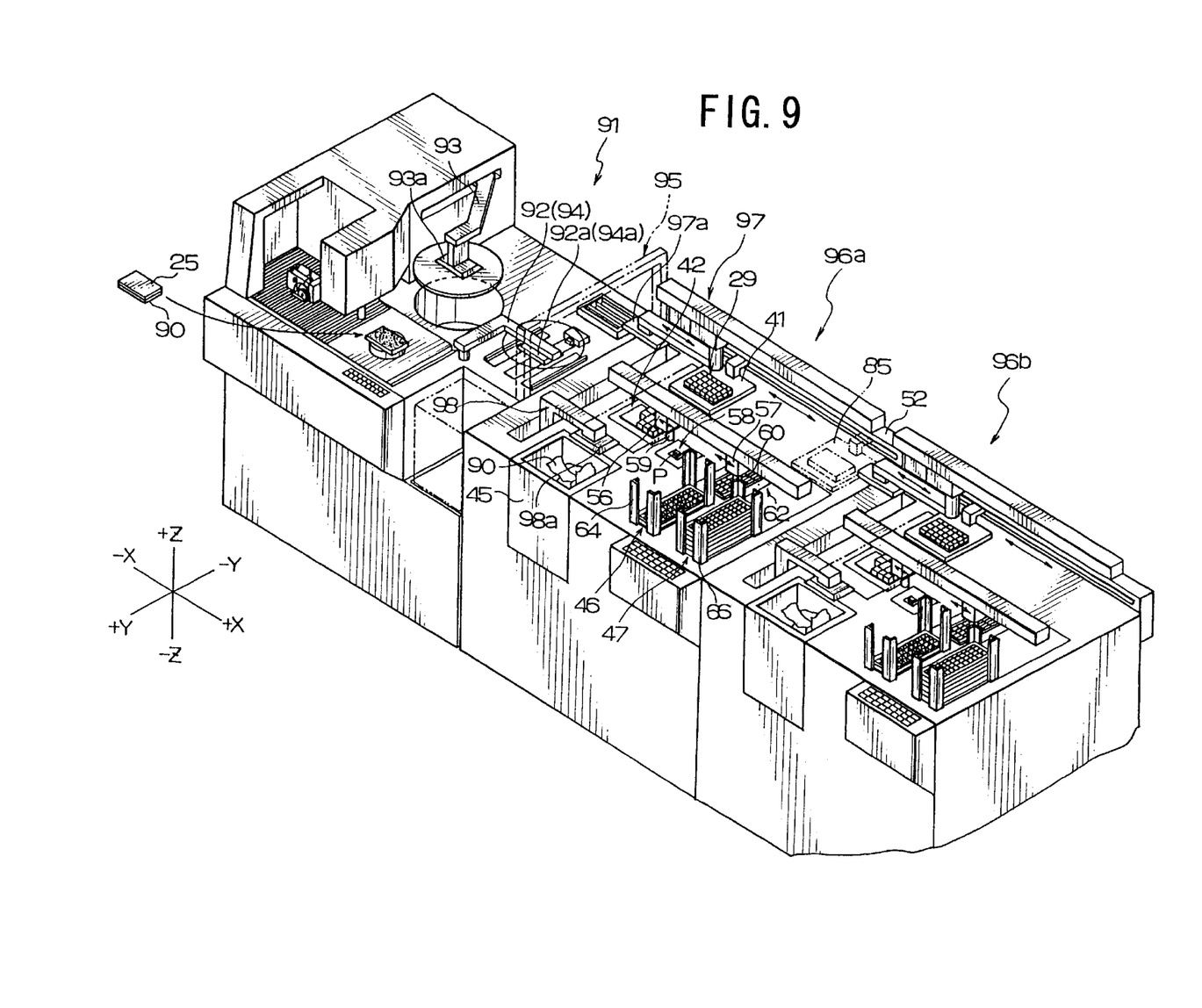
FIG. 9 is a perspective view of a cutting-and-transferring system according to a third embodiment of the present invention.

FIG. 9 shows another cascaded type of cutting and transferring system according to the third embodiment of the present invention, which is appropriate for handling CSP substrates each held by a retainer 90 as large as the CSP substrate rather than the frame F. Examples of such a retainer are a piece of adhesive tape and a resilient sheet-like piece having pores made on its surface. The CSP substrate can be held on the resilient sheet-like piece by pushing the substrate against the pored surface of the resilient piece to be sucked thereon. The resilient piece can be reused.

Figure 10:
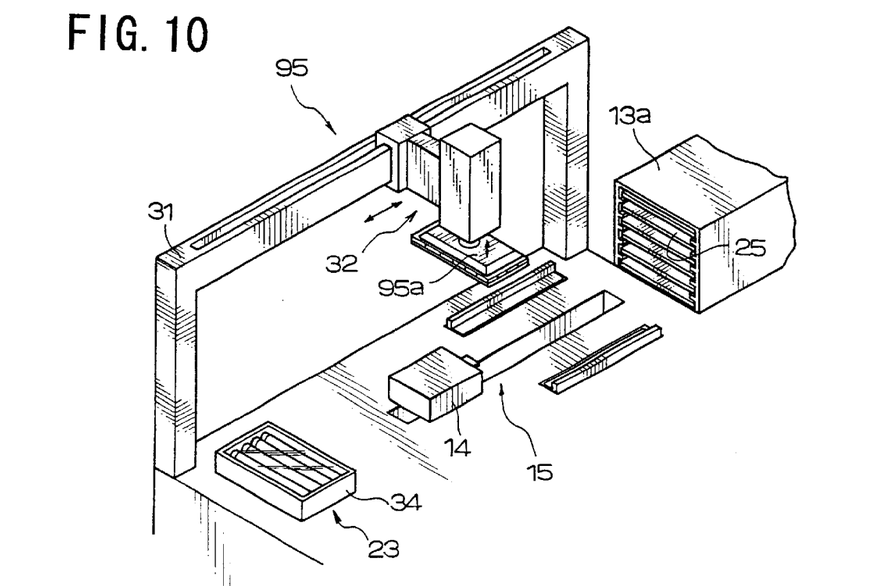
FIG. 10 is a perspective view of a fourth transferring means installed in the cutting unit of the cutting-and-transferring system of FIG. 9.

The system 91 of FIG. 9 is different from the system 10 of FIG. 1 only in that: in the cutting apparatus 91 the suction heads 92a, 93a, 94a and 95a of the first, second, third and fourth transferring means 92, 93, 94 and 95 are so configured as to suck the whole surface of the CSP substrate; and likewise, in the transferring apparatuses 96a and 96b the suction heads 97a and 98a of the shuttle transferring means 97 are so configured as to suck the whole surface of the CSP substrate (see FIG. 10). Everything else is similar to the corresponding one in FIG. 1, as indicated by same reference numerals as in FIG. 1.

Resilient, sheet-like retainers are collected for reuse at the disposal means 45. If disposable pieces of adhesive tape are used to hold CSP substrates, they can be collected at the disposal means 45 to be thrown away.

As may be understood from the above, immediately after completing the cutting of a selected CSP substrate the cut CSP can be shifted to the transferring apparatus, thus permitting the loading of carrier trays with pellets without delay. Thus, the length of time involved for cutting CSP substrates into pellets and loading carrier trays with pellets can be greatly reduced, compared with the cassette-by-cassette handling system in which: all CSP substrates taken out of a selected cassette are cut; and the so cut substrates are put in the cassette to be transferred to the transferring apparatus where the pellets are transferred from the cassette to carrier trays.

Advantageously a transferring apparatus according to the present invention can be series-connected to the existing cutting apparatus, thereby improving greatly the efficiency with which the cutting and loading work can be done.

What is claimed is:

1. A cutting-and-transferring system for cutting and separating a workpiece into pellets comprising:

a holding table for holding a workpiece to be cut, the workpiece being retained by a holder member;

a cutting unit including at least cutting means for cutting the workpiece on the holding table into pellets;

a transferring unit including at least transferring means for picking up the pellets from the holder member and for transferring to a selected carrier tray; and a shuttle transfer unit for transferring a selected cut workpiece from the cutting unit to the transferring unit.

2. A cutting-and-transferring system according to claim 1, wherein the shuttle transfer unit is attached to the transferring unit.

3. A cutting-and-transferring system according to claim 2, wherein the cutting unit comprises: a cassette storage area for storing a cassette containing a stack of workpieces; a carrying means for removing a selected workpiece from the cassette; a tentative storage area in which the workpiece thus removed and transferred is laid; a first transferring means for transferring the workpiece from the tentative area to the holding table; an alignment means for detecting the cutting area of the workpiece on the holding table; a cutting means for cutting the so detected cutting area of the workpiece; a washing means for washing the cut workpiece; a second transferring means for transferring the cut workpiece from the holding table to the washing means; a third transferring means for transferring the cut workpiece from the washing means to the tentative storage area; and a fourth transferring means for transferring the cut workpiece from the tentative storage area to a boarding area where the cut workpiece is picked up to be transferred from the cutting unit to the transferring unit; and the transferring unit comprises: the shuttle transferring unit that picks up the cut workpiece in the bordering area; a tentative storage means in which the cut workpiece is released from the shuttle transferring means to be tentatively laid there; a transfer means for transferring the cut workpiece from the tentative storage means to a pick-up table where the cut workpiece is laid to allow the pellets to be picked-up; a pellet transferring means for picking up pellets from the pick-up table to a selected carrier tray; a disposal means for disposing the holder members from which pellets have been removed by the pellet transferring means; an empty-tray storage means for storing empty trays; a loaded-tray storage means for storing trays loaded with pellets; and a tray-transferring table for transferring a selected empty tray from the empty-tray storage means to the pellet transferring means and for transferring a pellet-loaded tray to the loaded-tray storage means.

4. A cutting-and-transferring system according to claim 3, wherein the pellet transferring means comprises: a pellet orienting means; a first pick-up means for picking up pellets from the pick-up table to put the pellet thus picked up on the pellet orienting means; and a second pick-up means for picking up and transferring the oriented pellet from the pellet orienting means to a selected carrier tray.

5. A cutting-and-transferring system according to claim 3, further comprising additional transferring unit, which is placed to adjoin the transferring unit so that a selected cut workpiece may be transferred to the shuttle transferring means of the subsequent transferring unit via the tentative storage means.

6. A cutting-and-transferring system according to claim 3, 4 or 5, wherein it further comprises an ultraviolet radiator means placed in the boarding area, thereby permitting a selected cut workpiece to be exposed to ultraviolet rays when transferred from the tentative storage area to the boarding area, thus lowering the adhesive capability of the holder member of ultraviolet-sensitive adhesive tape.

* * * * *